United States Patent [19]
Evans, Jr.

[11] Patent Number: 5,977,577
[45] Date of Patent: *Nov. 2, 1999

[54] FERROELECTRIC BASED MEMORY DEVICES UTILIZING LOW CURIE POINT FERROELECTRICS AND ENCAPSULATION

[75] Inventor: Joseph T. Evans, Jr., Albuquerque, N.Mex.

[73] Assignee: Radiant Technologies, Inc, Albuquerque, N.Mex.

[*] Notice: This patent is subject to a terminal disclaimer.

[21] Appl. No.: 08/688,064

[22] Filed: Jul. 29, 1996

Related U.S. Application Data

[63] Continuation-in-part of application No. 08/406,376, Mar. 17, 1995, Pat. No. 5,541,807, and application No. 08/339,839, Nov. 15, 1994.

[51] Int. Cl.$^6$ .......................... H01L 29/76; H01L 29/94; H01L 31/062; H01L 31/113
[52] U.S. Cl. .......................... 257/295; 365/145; 365/171; 257/303
[58] Field of Search ........................... 257/295; 365/145, 365/171

[56] References Cited

U.S. PATENT DOCUMENTS

| | | | |
|---|---|---|---|
| 5,119,154 | 6/1992 | Gnadinger | 257/295 |
| 5,337,279 | 8/1994 | Gregory et al. | |
| 5,436,477 | 7/1995 | Hashizume et al. | 257/295 |
| 5,442,213 | 8/1995 | Okudaira et al. | 257/295 |
| 5,495,117 | 2/1996 | Larson | 257/295 |
| 5,499,207 | 3/1996 | Miki et al. | 365/149 |
| 5,525,528 | 6/1996 | Perino et al. | |
| 5,541,807 | 7/1996 | Evans, Jr. et al. | 257/295 |
| 5,561,307 | 10/1996 | Mihara et al. | 257/295 |
| 5,572,052 | 11/1996 | Kashihara et al. | 257/295 |
| 5,739,563 | 4/1998 | Kawakubo et al. | 257/295 |
| 5,760,432 | 6/1998 | Abe et al. | 257/295 |
| 5,850,089 | 12/1998 | Varshney et al. | 257/295 |

*Primary Examiner*—Mahshid Saadat
*Assistant Examiner*—Allan R. Wilson
*Attorney, Agent, or Firm*—Calvin B. Ward

[57] ABSTRACT

A ferroelectric memory cell for storing information. The information is stored in the remnant polarization of a ferroelectric dielectric layer by setting the direction of the remnant polarization. The ferroelectric memory cell is designed to store the information at a temperature less than a first temperature. The memory cell includes top and bottom contacts that sandwich the dielectric layer which includes a ferroelectric material having a Curie point greater than the first temperature and less than 400° C. The dielectric layer is encapsulated in an oxygen impermeable material such that the encapsulating layer prevents oxygen from entering or leaving the dielectric layer. One of the contacts is typically includes a platinum electrode. The other contact may include a similar electrode or a semiconductor layer having electrodes spaced apart thereon.

10 Claims, 5 Drawing Sheets

FERROELECTRIC BASED MEMORY DEVICES UTILIZING LOW CURIE POINT FERROELECTRICS AND ENCAPSULATION

This application is a continuation-in-part of U.S. patent application Ser. No. 08/406,376 filed Mar. 17, 1995 now U.S. Pat. No. 5,541,807 issued Jul. 30, 1996, and U.S. patent application Ser. No. 08/339,839 filed Nov. 15, 1994.

FIELD OF THE INVENTION

The present invention relates to ferroelectric based memory devices, and more particularly, to an improved ferroelectric capacitor and ferroelectric FET for use in memory systems.

BACKGROUND OF THE INVENTION

Computer memories may be conveniently classified in terms of whether or not the memory retains the information stored therein when power is removed from the memory. Conventional DRAMs and SRAMs are examples of memories that lose their contents when power is removed. EEPROM and flash RAM are examples of non-volatile memories. The cost of non-volatile memories per bit remains sufficiently high to discourage their use in many applications. In addition, the underlying memory structures may only be written a relatively small number of times compared to volatile memories. For example, an EEPROM memory cell can only be written approximately $10^4$ times. In addition, the time required to write data into an EEPROM is much longer than that required to write volatile memories. Hence, EEPROM cells have a relatively limited class of applications.

One class of non-volatile memory device stores information by altering the direction of polarization of a ferroelectric dielectric layer within device. These devices are structurally similar to capacitors in which the dielectric layer is replaced by a ferroelectric material. In fact, one class of devices is structurally a capacitor in which the dielectric layer is replaced by a ferroelectric layer. In these devices, the ferroelectric dielectric may be polarized in one of two directions. The direction of polarization is used to store information, a "1" corresponding to one direction of polarization and a "0" corresponding to the other direction of polarization. The polarization of the dielectric is maintained when power is removed from the system, thus providing non-volatile operation.

The direction of the polarization may be sensed by applying a potential sufficient to switch the polarization across the capacitor. For the purposes of this discussion, assume that the applied potential difference is such that it would switch the dielectric to the polarization state corresponding to a "1". If the capacitor was polarized such that it stored a "1" prior to the application of the read potential, the polarization will not be altered by the read voltage. However, if the capacitor was polarized such that it stored a "0" prior to the application of the read potential, the polarization direction will switch. This switching will give rise to a current that flows from one plate of the capacitor to the other. A sense amplifier measures the current that flows in response to the read potential to determine the state of the capacitor. Once the capacitor has been read, the data must be rewritten in the capacitor if the read potential caused the state of the capacitor to switch.

A ferroelectric capacitor is normally constructed by depositing a layer of the ferroelectric material on a bottom electrode and then depositing a top electrode on the ferroelectric layer. Ferroelectric layers based on PZT are well known to those skilled in the art. These materials are heated to relatively high temperatures after deposition to provide a perovskite structure having the desired ferroelectric properties. After the annealing process, the dielectric film contains of a large number of domains. Each individual domain has a spontaneous polarization equivalent to that of a mono-domain single crystal of the perovskite material. At the end of the deposition process, domains are usually randomly oriented.

While this type of memory has been known to the art for some time, commercial realizations of this type of memory have been limited because of two problems, commonly referred to as "imprint" and "fatigue". Imprint is the tendency of a ferroelectric capacitor to exhibit a shift of its hysteresis curve along the voltage axis in either the positive or negative direction depending on the data stored therein. This tendency can lead to a logic state failure for either of two reasons. First, after a sufficient shift, both logic states appear the same to a sense amplifier. Second, the coercive voltage becomes too large to be switched by the available programming voltage. When either case is encountered, a memory cell based on the capacitor becomes useless.

Fatigue is the decrease in the magnitude of the remnant polarization of the dielectric layer with the number of times the direction of polarization is changed. Since the amount of charge displaced when the capacitor is switched is related to the remnant polarization, the capacitor finally reaches a point at which there is insufficient charge displaced to detect. At this point, a memory cell based on the capacitor also becomes useless.

Memory devices based on ferroelectric FETs are also known to the art. These structures may be viewed as a capacitor in which the top electrode has been replaced by a layer of semiconductor material having two electrodes deposited thereon and spaced apart from each other. Data is once again stored in the direction of polarization of the ferroelectric dielectric layer. The state of polarization gives rise to an electric field which alters the resistivity of the semiconductor layer. That is, the resistance measured between the two electrodes depends on the direction of polarization of the ferroelectric layer. This class of devices have the advantage of not requiring the ferroelectric layer to be switched each time the device is read.

Memories based on prior art ferroelectric FETs exhibit retention problems which limit the usefulness of such devices. If data is not periodically rewritten, the data is lost. Prior art ferroelectric FET memories also exhibit fatigue problems.

To simplify the following discussion, the term ferroelectric memory cell will be defined to include both ferroelectric FETs and ferroelectric capacitors. As noted above, these devices may be viewed as differing in the manner in which the top electrode of a capacitor is constructed.

While more or less ideal ferroelectric memory cells can be demonstrated in the laboratory, attempts to incorporate these cells into packaged memory chips have failed to provide satisfactory parts. In general, a memory chip includes circuitry constructed on a silicon substrate utilizing conventional CMOS fabrication techniques. The CMOS circuitry provides the isolation transistors, sense amplifiers, and decoding circuitry needed to pick specific ferroelectric memory cells for reading and writing. The ferroelectric memory cells are typically constructed after the CMOS circuitry has been constructed on pads adjacent to the CMOS isolation transistors. However, memories in which the ferroelectric memory cells are constructed over the CMOS isolation transistors have also been described. In this later case, an isolation layer such as silicon dioxide is first deposited over the CMOS structures.

After the ferroelectric memory cells have been constructed over the CMOS circuitry, a number of further processing steps are needed to complete the memory. Two of these are common to all types of memories. First, various connections between the ferroelectric memory cells and the underlying CMOS circuitry must be made by depositing a conductor such as aluminum. Second, the entire circuit is then covered with a passivation layer such as silicon dioxide. The passivated wafer is then subjected to a forming gas anneal in which it is heated to 350 to 400° C. in a hydrogen/nitrogen atmosphere.

While satisfactory devices can be demonstrated up to the completion of these last two steps, something in these steps leads to deterioration in device performance. After the forming gas anneal, capacitor based devices exhibit unacceptable imprint problems and poor hysteresis curves. Similarly, ferroelectric FET based devices exhibit poor hysteresis curves and poor data retention.

Broadly, it is the object of the present invention to provide an improved ferroelectric memory cell.

It is a further object of the present invention to provide a ferroelectric memory cell that still operates satisfactorily after being subjected to subsequent processing steps including a forming gas anneal.

These and other objects of the present invention will become apparent to those skilled in the art from the following detailed description of the invention and the accompanying drawings.

SUMMARY OF THE INVENTION

The present invention is a ferroelectric memory cell for storing information. The information is stored in the remnant polarization of a ferroelectric dielectric layer by setting the direction of the remnant polarization. The ferroelectric memory cell is designed to store the information at a temperature less than a first temperature. The memory cell includes top and bottom contacts that sandwich the dielectric layer which includes a ferroelectric material having a Curie point greater than the first temperature and less than 400° C. The dielectric layer is encapsulated in an oxygen impermeable material such that the encapsulating layer prevents oxygen from entering or leaving the dielectric layer. One of the contacts is typically includes a platinum electrode. The other contact may include a similar electrode or a semiconductor layer having electrodes spaced apart thereon.

DETAILED DESCRIPTION OF THE INVENTION

Figure 1:
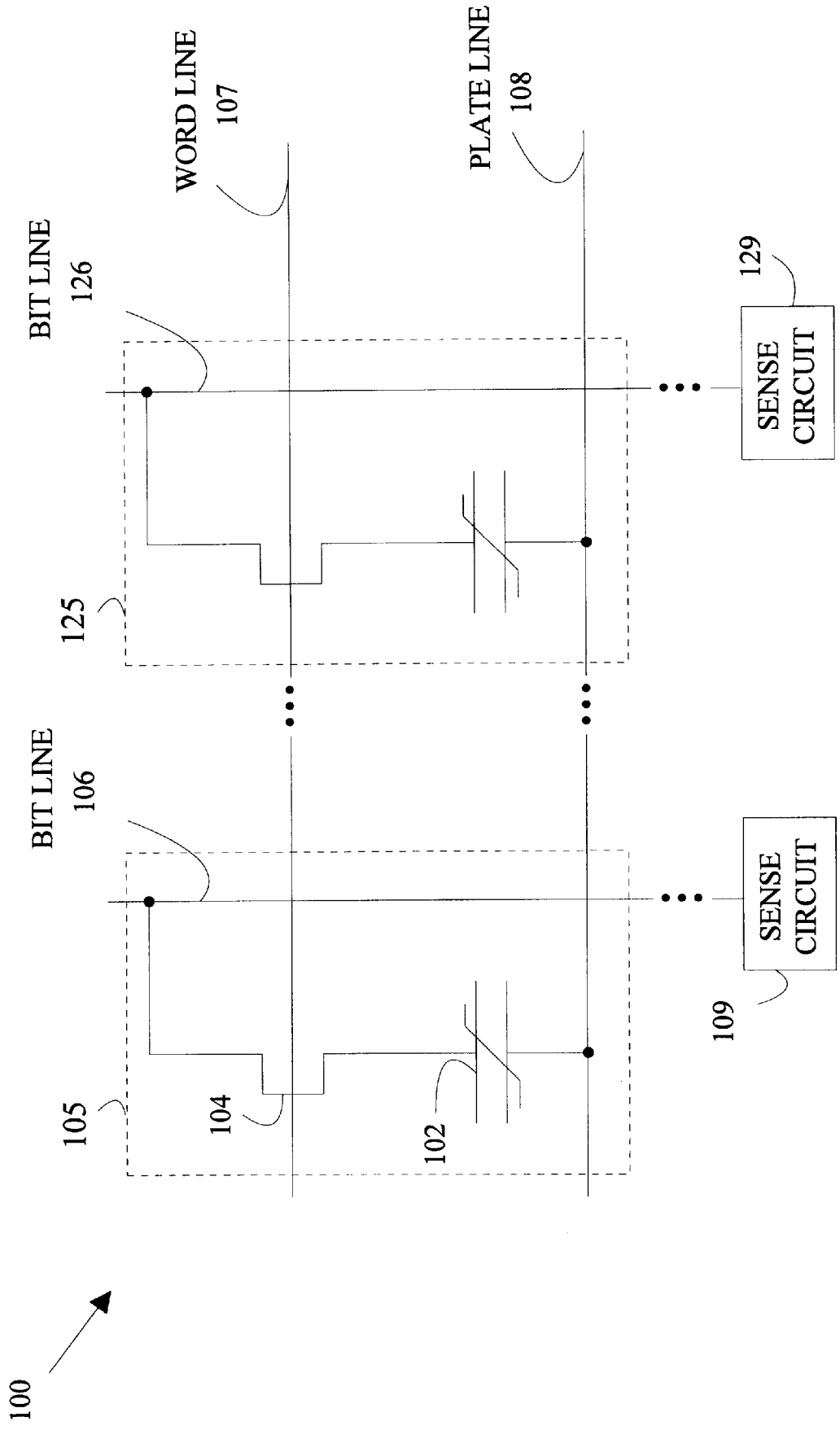
FIG. 1 is a schematic drawing of a memory cell utilizing a ferroelectric capacitor.

A one bit memory cell in a larger memory typically includes an isolation transistor and a ferroelectric memory cell. As noted above, the ferroelectric memory cell may be based on a capacitor or a ferroelectric FET. Refer now to FIG. 1 which is a schematic drawing of a word of memory in a memory system based on ferroelectric capacitors. Word 100 includes a plurality of one bit cells of which cells 105 and 125 are typical. Each one bit memory cell includes a ferroelectric capacitor 102 combined with a transistor 104. The ferroelectric material of the capacitor has an electrically reversible remnant polarization. When reversed, a large compensating electrical charge must flow between the two plates of the capacitor. Transistor 104 acts as a switch that connects capacitor 102 to a bit line of which bit lines 106 and 126 are typical. This connection is made in response to a signal on word line 107. A sensing circuit associated with each of the bit lines measures the flow of charge into capacitor 102. A typical sense circuit is shown at 109.

To execute a write, the word line is activated to turn on transistor 104, bit line 106 is set high or low, and then the plate line 108 is pulsed. The direction of polarization of the capacitor is set by the state of bit line 106.

To execute a read, transistor 104 is turned on, and plate line 108 is pulsed. The charge on the capacitor is forced onto bit line 106 where it is measured by sense circuit 109. If the capacitor polarization is switched by the read pulse, a current will flow on bit line 106. If, on the other hand, the polarization of capacitor 102 is already oriented in the direction provided by the read pulse, only a small current will flow on bit line 106. In either case, the polarization will be pointing in the direction specified by the read pulse after the read operation, independent of the original direction of polarization of capacitor 102. If the data was destroyed by the read operation, sense circuit 109 re-writes the correct data after the read operation.

Figure 2:
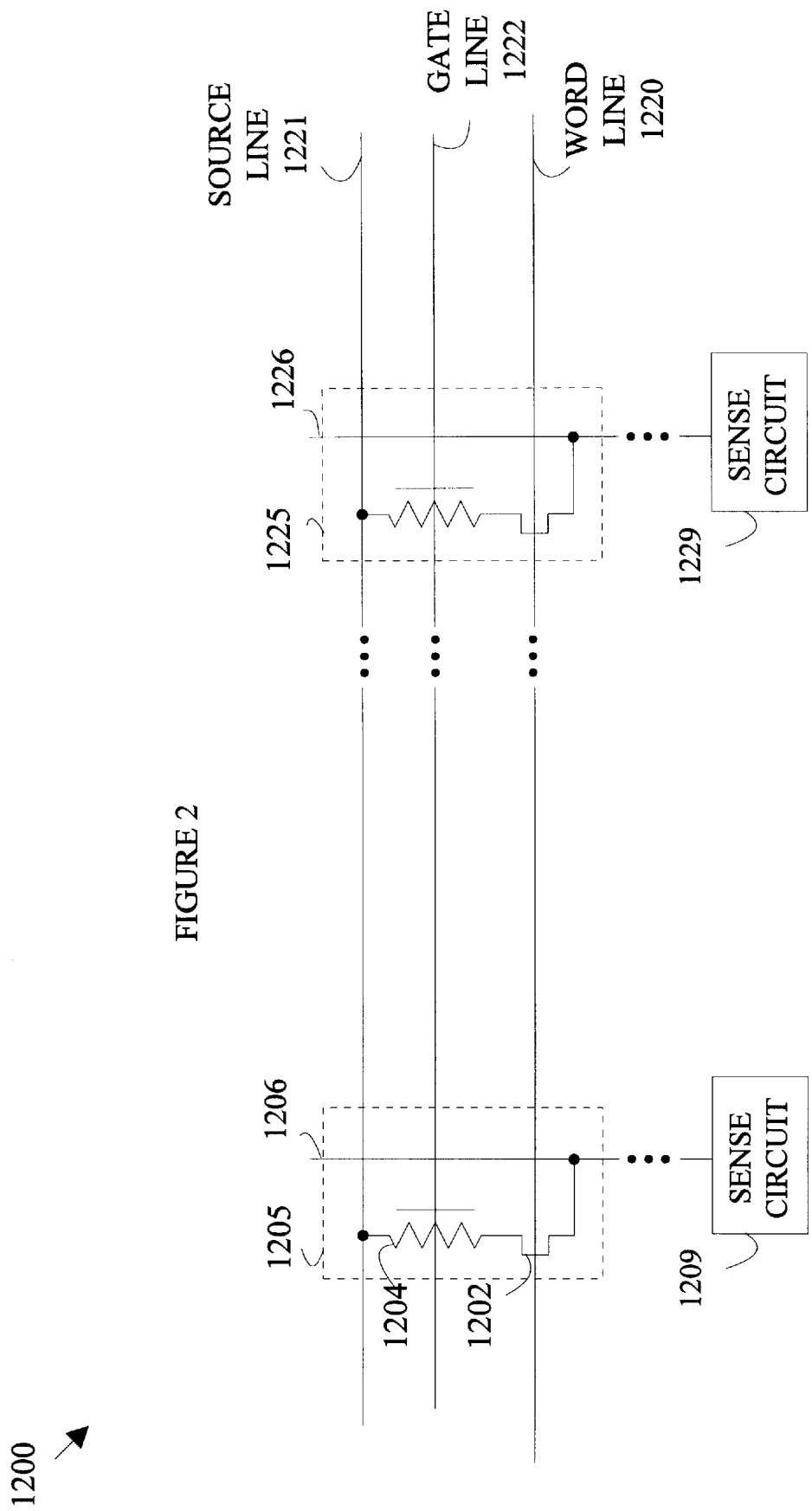
FIG. 2 is a schematic drawing of a word of memory which utilizes ferroelectric FETs to store the data.

Memories based on ferroelectric FETs are somewhat more complicated in that a number of different single word memory architectures are possible. However, all of these architectures include a ferroelectric FET that is connected to a pass transistor. Refer now to FIG. 2 which is a schematic drawing of a word 1200 of memory which utilizes ferroelectric FETs to store the data. Each bit in word 1200 includes a ferroelectric FET. Each bit is stored in a one bit memory cell of which one bit memory cells 1205 and 1225 are typical. Each one bit memory cell couples a source line 1221 to a bit line. The bit lines for one bit memory cells 1205 and 1225 are shown at 1206 and 1226, respectively. Each one bit memory cell includes a ferroelectric FET 1204 and a pass transistor 1202 which connects ferroelectric FET 1204 between source line 1221 and the corresponding bit line. The resistance of each selected ferroelectric FET 1204 is measured by a sense circuit. The sense circuit corresponding to bit lines 1206 and 1226 are shown at 1209 and 1229, respectively. The pass transistors are controlled via a word line 1220. The manner in which data is read into the ferroelectric FETs depends on the specific architecture being utilized. For the purposes of the present discussion, it is sufficient to note that the polarization of the ferroelectric dielectric may be switched by applying appropriate signals to source line 1221 and gate line 1222 in conjunction with a signal on word line 1220.

Figure 4:
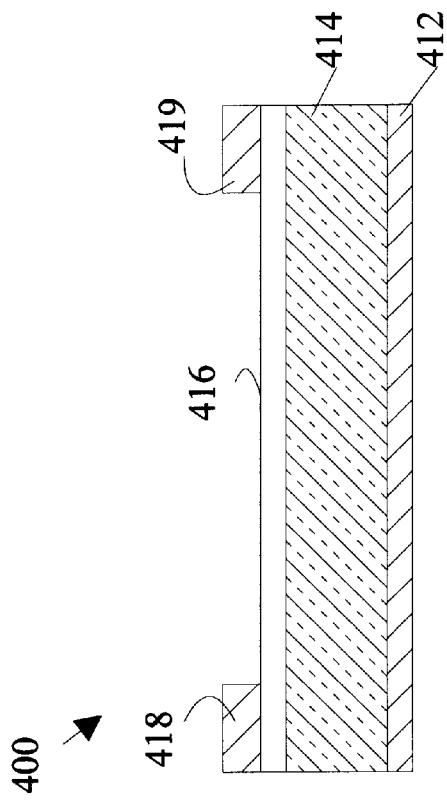
FIG. 4 is a cross-sectional view of a ferroelectric FET.
Figure 3:
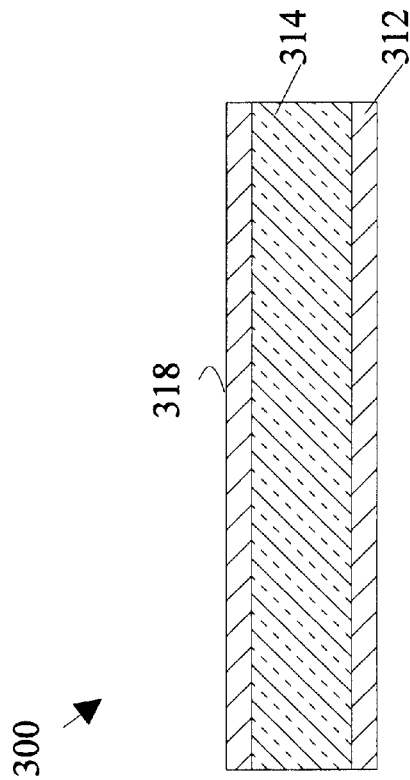
FIG. 3 is a cross-sectional view of a ferroelectric capacitor.

A cross-sectional view of a typical ferroelectric capacitor is shown in FIG. 3 at 300. Capacitor 300 includes a bottom electrode 312, a ferroelectric dielectric layer 314 and a top electrode 318. For comparison, a cross-sectional view of a typical ferroelectric FET is shown in FIG. 4 at 400. Ferroelectric FET 400 also includes a bottom electrode shown at 412 and a ferroelectric dielectric layer 414 shown at 414. A semiconductor layer 416 is deposited over the ferroelectric dielectric layer 414. Two electrodes, 418 and 419 are then deposited on semiconductor layer 416. Semiconductor layer 416 may be viewed as a variable resistor whose resistance is modulated by the polarization of ferroelectric dielectric layer 414. The resistance of semiconductor layer 416 may be measured by measuring the current that flows between electrodes 418 and 419 when a potential is applied between these two electrodes. Bottom electrode 412 is analogous to the gate of a conventional FET, and electrodes 418 and 419 are analogous to the drain and source of a conventional FET.

From a comparison of FIGS. 1 and 2 it will be apparent that both types of memories have a number of features in common. Each word of memory is constructed from a plurality of ferroelectric memory cells in which each ferroelectric memory cell is connected to a pass transistor. In both cases, the bottom electrode of each ferroelectric memory cell is connected to a common line and one of the connections on the top of the ferroelectric memory cell is connected to the pass transistor. In the case of a ferroelectric FET-based memory, there is a second connection on the top of the ferroelectric memory cell.

The manner in which the present invention gains its advantages over the prior art may be more easily understood with reference to FIGS. 5–10 which are cross-sectional views of a memory cell 200 at various stages in the fabrication process. Memory cell 200 is based on a ferroelectric capacitor. However, it will be apparent to those skilled in the art from the preceding discussion that the teachings of the present invention may also be applied to a memory cell based on a ferroelectric FET.

Figure 5:
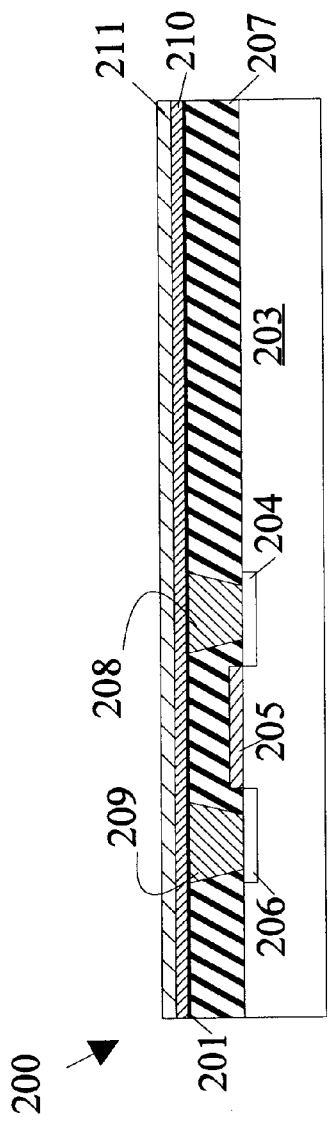
FIGS. 5–10 are cross-sectional views of a memory cell according to the present invention at various stages in the fabrication process.

Refer now to FIG. 5. It is assumed that the isolation transistor has already been fabricated on the silicon substrate 203. The drain, gate, and source of transistor are shown at 204, 205, and 206, respectively. Transistor has been covered by a layer of $SiO_2$ 207 through which vias have been etched. Contacts 208 and 209 are grown, preferably from polysilicon, in these vias. A platinum layer 210 of approximately 1500 Å is deposited on top of the $SiO_2$ layer 207 and makes electrical contact with contact 208. An approximately 600 Å layer of an ohmic material 211 is then deposited on platinum layer 210. The preferred ohmic contact material is LSCO (lanthanum strontium cobalt oxide). The ohmic contact material reduces fatigue problems. However, embodiments in which the ohmic contact layer is not utilized can also be constructed without deviating from the teachings of the present invention.

In the preferred embodiment of the present invention, a thin layer 201 of titanium or titanium nitride is deposited on the $SiO_2$ layer before depositing the platinum layer. This layer acts as a "glue" for bonding the platinum to the polysilicon and $SiO_2$. In addition, the glue layer prevents the polysilicon and platinum layers from interacting. The glue layer is typically 200 Å.

Figure 6:
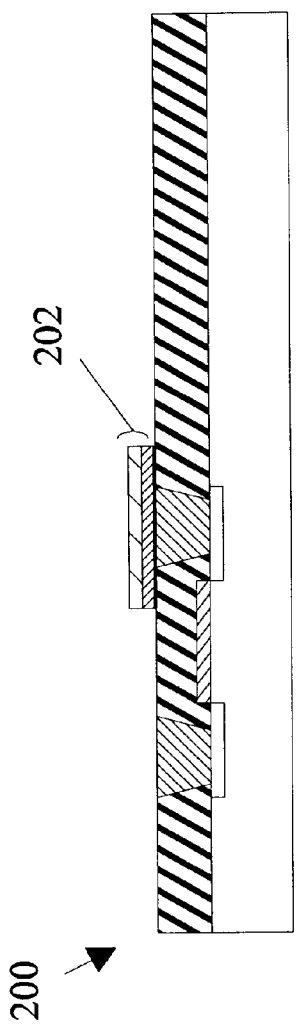
Figure 7:
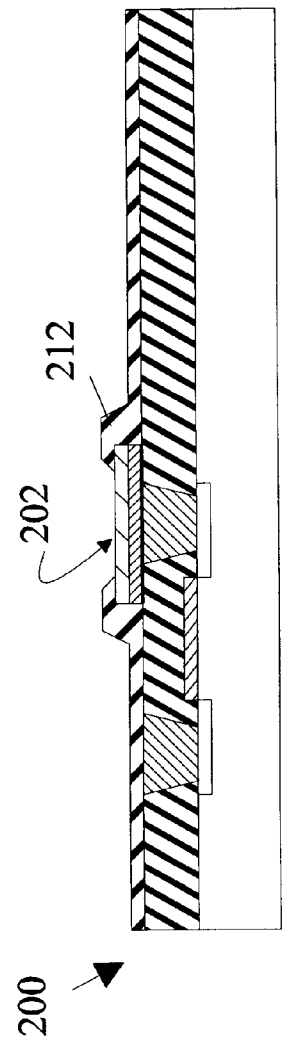

Refer now to FIG. 6. After the above described layers are deposited, the ohmic contact and platinum layers are etched to form the lower electrode of the capacitor 202. This etching operation is preferably carried out as an ECR Chlorine plasma RIE. A barrier layer 212 of approximately 600 Å is then deposited over the surface of the chip and a window opened over electrode 202 as shown in FIG. 7. The preferred barrier layer is $TiO_2$ which is etched using a $CCl_4$ or $CF_4$ plasma. The barrier layer is needed to prevent interaction between the ferroelectric layer and the $SiO_2$ around the platinum contact.

Figure 8:
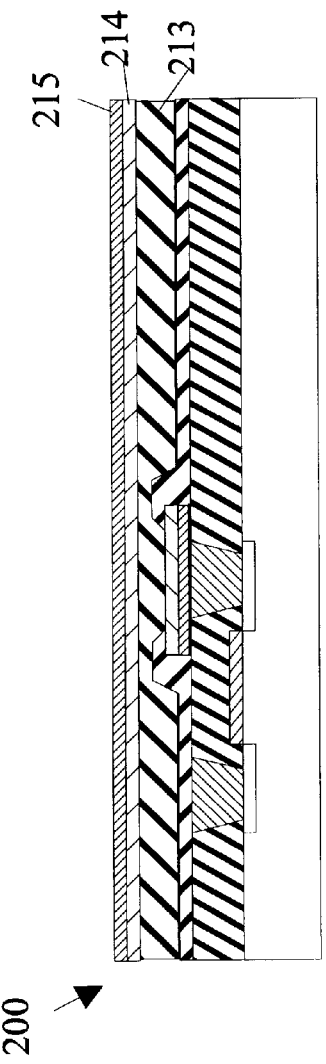
Figure 9:
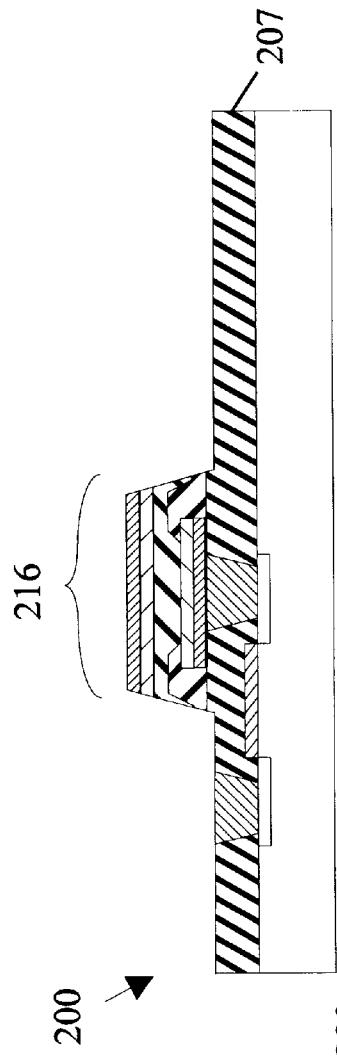

The ferroelectric layer 213 (approximately 1200 Å) and the upper electrode comprising ohmic layer 214 (approximately 600 Å) and platinum layer 215 (approximately 1000 Å) are then deposited as shown in FIG. 8. These layers are then stack etched using an ECR Chlorine plasma RIE to provide the capacitor structure shown in FIG. 9 at 216. It should be noted that the stack etch is timed to stop after removing the barrier layer in those regions that do not underlie top electrode 215. The stack etch extends into a portion of the $SiO_2$ layer 207. The end point of the etch may be detected by observing the material removed during the etch, the end point being that point at which Ti is no longer present in the removed material.

Figure 10:
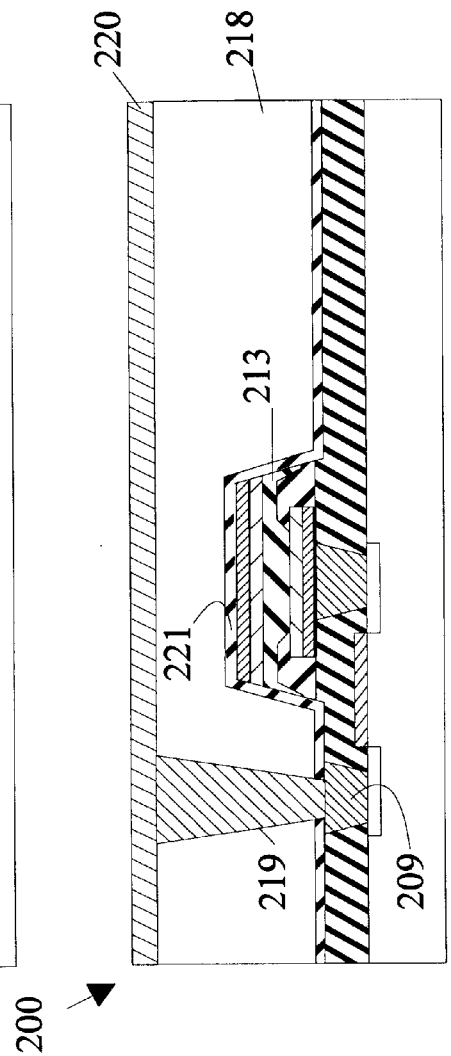

Refer now to FIG. 10. After stack etching the top electrode structure and ferroelectric dielectric layer, a layer 221 (approximately 400 Å) of dielectric material, preferably $TiO_2$, is deposited on the chip. This layer is then covered with a layer 218 (approximately 2000 Å) of $SiO_2$ and vias opened to the polysilicon contact 209. The via is etched in two steps. First, a $CF_4$ plasma etch is used to remove the $SiO_2$. Then a $CCl_4$ etch is used to remove the $TiO_2$. A polysilicon extension 219 of contact 209 is then grown and the aluminum bit lines 220 deposited. Alternatively, the extension may be constructed by filling the well with aluminum instead of polysilicon. Prior to depositing the aluminum, the wafer may be annealed to recover any damage to the ferroelectric caused by the deposition of the dielectric layer 221.

As noted above, the circuit is typically covered with a passivation layer such as silicon dioxide. The passivated wafer is then subjected to a forming gas anneal in which it is heated to 350 to 400° C. in a hydrogen/nitrogen atmosphere. In prior art memory systems, this final step damages the ferroelectric memory cells and renders the memories effectively useless.

The present invention is based on a number of observations. The preferred ferroelectric dielectric is based on PZT. The preferred dielectric is lead zirconium titanate that has been doped with a material that has an oxidization state greater than +4. The dielectric is deposited and annealed to form a perovskite structure. The simple perovskite structure is a cubic unit cell. A large cation (A) occupies the corners of the cube, a smaller cation (B) occupies the body center position, and oxygen ions occupy the center of the faces of the unit cell. A generalized chemical formula for this structure is conventionally represented by $ABO_3$. For PZT materials, the A-site is typically occupied by lead, and the B-site is typically occupied by zirconium or titanium. The number of oxygen vacancies has been found to be important to device performance. The use of a dopant having an oxidation state greater than +4 allows the oxygen vacancy effects to be controlled.

The present invention is partially based on the observation that damage caused by the forming gas anneal results from two factors. The first is the generation of a non-uniform charge distribution in the ferroelectric layer which is generated when the ferroelectric layer is heated during the forming gas anneal. When the ferroelectric layer is originally deposited and crystallized, the layer has domains that are electrically polarized, and hence, provide a local electric field. However, any carriers present are uniformly distributed. When the layer is heated to a temperature below the Curie point of the ferroelectric material, carriers are elevated into the conduction band and move under the influence of these local electric fields. These carriers are then frozen at the ends of the domains when the device is cooled after the forming gas anneal leading to a non-uniform charge distribution.

This non-uniform charge distribution can be removed by heating the ferroelectric to a temperature above its Curie point. At temperatures above the Curie point, the domains and the electric fields created thereby disappear. The accumulated charge then moves under the its own electric field and is redistributed. The device is then quickly cooled to prevent the reintroduction of the non-uniform charge distributions when the domains re-form. Hence, in principle, the damage caused by the heating during forming gas anneal could be reversed by annealing the ferroelectric memory cells at a temperature above the Curie point of the ferroelectric dielectric. Unfortunately, prior art devices have been constructed with ferroelectric layers constructed from materials that have Curie points above 450° C. Hence, the anneal would need to be done at temperatures in excess of 450° C. Such an anneal would damage the aluminum conductors used for the long conduction paths in the circuit.

The second source of damage caused by the forming gas anneal results from alterations in the oxygen vacancies distribution in the ferroelectric layer. When the ferroelectric memory cell is heated in a hydrogen atmosphere, oxygen can escape from the ferroelectric layer. This loss of oxygen effects the density of oxygen vacancies. As noted above, it has been found experimentally that the level of oxygen vacancies must be controlled. Hence, even if one uses a ferroelectric layer with a Curie point below the temperature at which the conductors are damaged, the loss of oxygen during the forming gas anneal cannot be corrected.

The present invention achieves its advantages by utilizing a combination of a low Curie point ferroelectric and an oxygen impermeable barrier that prevents oxygen transfer during the forming gas anneal. In the preferred embodiment of the present invention, the ferroelectric layer is constructed from a PZT composition that has a Curie point 50° C. below the temperature at which the forming gas anneal is performed. Hence, the forming gas anneal will no longer lead to a non-uniform charge distribution. In fact, the forming gas anneal will remove any non-uniform charge distributions caused by fabrications steps in which the ferroelectric layer was heated after the layer has been crystallized. Since the forming gas anneal is normally carried out at 350–400° C., the present invention preferably utilizes a PZT composition with a Curie point between 300° C. and 400° C.

It should be noted that there is a lower bound to the Curie point that may be utilized. Memory devices store information in the remnant polarization of the ferroelectric. Typically, a polarization in one direction is used to store a "0", and a polarization in the other direction is used to store a "1". If the operating temperature of the device is too near the Curie point, information will be lost, since the remnant polarization also disappears at the Curie point. In this regard, it is important to note that there is a statistical distribution of domains in most ferroelectric compositions. Hence, some of the domains will be lost before the temperature reaches the Curie point. As a result, the present invention utilizes a ferroelectric with a Curie point which is preferably 150° C. above the operating temperature of the memory. In general, the highest Curie point consistent with a recovery anneal which can be carried out at 450° C. for 15 minutes or 400° C. for 30 minutes is preferred.

Table I lists a number of different PLZT compositions and the Curie points of the resulting dielectrics. Here, a composition of x/y/z means that the ferroelectric has x% lead in the A site, and the remaining A sites are filed with La. The B sites have y% Zr and z% Ti.

TABLE I

| Composition | Curie Point (° C.) |
| --- | --- |
| 8/20/80 | ~300 |
| 8/40/60 | 240 |
| 12/40/60 | 140 |
| 0/65/35 | 370 |
| 2/65/35 | 320 |
| 6/65/35 | 190 |
| 7/65/35 | 155 |
| 8/65/35 | 110 |
| 1/45/55 | ~380 |
| 4/30/70 | ~380 |

It should be noted that the dopants with oxidation states greater than +4 mentioned above also depress the Curie point of the PZT. Hence, a low Curie point ferroelectric constructed from PZT having such a dopant provides a dual benefit. For example, PZT doped with 1% to 4% Nb provides a Curie point in the 300° C. to 350° C. range. Similarly, PZT doped with tungsten in the 0.5% to 2% range may also be utilized.

As noted above, annealing above the Curie point alone will not cure the defects caused by the exchange of oxygen between the ferroelectric layer and the forming anneal gas mixture. The present invention overcomes this problem by encapsulating the ferroelectric layer in an oxygen impermeable barrier material. In the preferred embodiment of the present invention the oxygen barrier material is $TiO_2$. Such an encapsulating layer is shown at 221 FIG. 9. The encapsulation prevents oxygen exchange, and hence, prevents the damage caused by the forming gas anneal.

While the above description has utilized drawings which refer to the fabrication of a capacitor, it will be appreciated that the teachings of the present invention may be equally applied to ferroelectric memory cells based on ferroelectric FETs. Structurally, the ferroelectric FET replaces the top electrode with a semiconductor layer with two electrodes. Hence, a second connection must be made to the top electrode. However, the use of the encapsulation together with a low Curie point ferroelectric is just as important in ferroelectric FET based devices, as these devices suffer from damage resulting from the forming gas anneal. The damage results from changes in the ferroelectric layer, and hence, the structure of the top electrode has little effect on the damage.

The above described embodiments of the present invention have utilized specific forms of electrodes. However, it will be appreciated that the advantages of the present invention are independent of the type of electrode structure utilized.

It should be noted that in the case of a ferroelectric FET, the preferred semiconductors for the "top electrode" are also oxides whose conductivity are determined by the concentration of oxygen vacancies. The encapsulation of the device in an oxygen impermeable barrier also protects this semiconductor layer from changes in the oxygen vacancy concentration during annealing operations performed after the deposition of the semiconductor layer.

While the above described embodiments of the present invention have utilized primarily PZT based ferroelectrics, it will b apparent to those skilled in the art that the teachings of the present invention may also be applied to other ferroelectric materials such as strontium bismuth tantalate.

Various modifications to the present invention will become apparent to those skilled in the art from the foregoing description and accompanying drawings.

Accordingly, the present invention is to be limited solely by the scope of the following claims.

What is claimed is:

1. A ferroelectric memory cell for storing information, said memory cell operating to store said information at a temperature less than a first temperature, said memory cell comprising:

a bottom contact;

a dielectric layer comprising a ferroelectric material having a Curie point greater than said first temperature and less than 400° C., said ferroelectric material having a remnant polarization below said first temperature, said information being stored by altering said remnant polarization, said dielectric layer having a top surface, a bottom surface, and first and second side surfaces;

a top contact, said dielectric layer being sandwiched between said bottom contact and said top contact, said top contact being in contact with said top surface of said dielectric layer and said bottom contact being in contact with said bottom surface of said dielectric layer; and an encapsulating layer comprising an oxygen impermeable material, said encapsulating layer preventing oxygen from entering or leaving said dielectric layer through said first and second side surfaces of said dielectric layer.

2. The ferroelectric memory cell of claim 1 wherein said ferroelectric material comprises lead zirconium titanate.

3. The ferroelectric memory cell of claim 1 wherein said bottom contact comprises a platinum electrode.

4. The ferroelectric memory cell of claim 3 wherein said top contact comprises a platinum electrode.

5. A ferroelectric memory cell for storing information, said memory cell operating to store said information at a temperature less than a first temperature, said memory cell comprising:

a bottom contact;

a dielectric layer comprising a ferroelectric material having a Curie point greater than said first temperature and less than 400° C., said ferroelectric material having a remnant polarization below said first temperature, said information being stored by altering said remnant polarization, said dielectric layer having a top surface, a bottom surface, and side surfaces;

a top contact, said dielectric layer being sandwiched between said bottom contact and said top contact, said top contact being in contact with said top surface of said dielectric layer and said bottom contact being in contact with said bottom surface of said dielectric layer; and an encapsulating layer comprising an oxygen impermeable material, said encapsulating layer preventing oxygen from entering or leaving said dielectric layer through said side surfaces of said dielectric layer, wherein said bottom contact comprises a platinum electrode and wherein said top contact comprises a semiconducting layer and first and second top electrodes, said first and second top electrodes being spaced apart on said semiconducting layer.

6. The ferroelectric memory cell of claim 1 wherein said oxygen impermeable material comprises an oxide of titanium.

7. The ferroelectric memory cell of claim 2 wherein said ferroelectric material is doped with an element having an oxidation state greater than +4.

8. The ferroelectric memory cell of claim 7 wherein said doping element is chosen from a group consisting of Nb, Ta, and W.

9. The ferroelectric memory cell of claim 7 wherein said doping element is present in a concentration of between 1% and 8%.

10. The ferroelectric memory cell of claim 1 wherein said top contact comprises a semiconducting layer and first and second top electrodes, said first and second top electrodes being spaced apart on said semiconducting layer.

* * * * *

UNITED STATES PATENT AND TRADEMARK OFFICE
CERTIFICATE OF CORRECTION

PATENT NO : 5,977,577
DATED : November 2, 1999
INVENTOR(S): Joseph T. Evans, Jr.

It is certified that error appears in the above-identified patent and that said Letters Patent is hereby corrected as shown below:

Abstract, line 13; Delete "is" after "contacts".

Column 2, line 6; Delete "of" at beginning of line.

Column 2, line 44; Replace "have" at beginning of line with -- has --.

Column 3, line 48; Delete "is" after "contacts".

Column 4, line 66; Delete "414" between "layer" and "shown".

Column 5, line 34; Insert -- the -- after "of".

Column 5 line 35; Insert --The-- before "Transistor".

Column 5, line 35; Replace "Transistor" with -- transistor --.

Column 7, line 3; Delete "the" after "under".

Column 7, line 7; Insert -- the -- after "during".

Column 7, line 40; Replace "fabrications" with -- fabrication -- after "by".

Column 8, line 30; Insert -- in -- after "221".

Column 8, line 54; Replace "are" with -- is -- after "conductivity".

UNITED STATES PATENT AND TRADEMARK OFFICE
CERTIFICATE OF CORRECTION

PATENT NO. : 5,977,577
DATED : November 2, 1999
INVENTOR(S) : Joseph T. Evans, Jr.

It is certified that error appears in the above-identified patent and that said Letters Patent is hereby corrected as shown below:

Column 8, line 62; Replace "b" with -- be -- after "will".

Signed and Sealed this

Sixteenth Day of May, 2000

Attest:

Q. TODD DICKINSON

Attesting Officer          Director of Patents and Trademarks